(12) United States Patent
Nishio et al.

(10) Patent No.: US 10,998,401 B2
(45) Date of Patent: May 4, 2021

(54) SEMICONDUCTOR DEVICE HAVING A BASE BODY OF SILICON CARBIDE

(71) Applicant: KABUSHIKI KAISHA TOSHIBA, Minato-ku (JP)

(72) Inventors: Johji Nishio, Machida (JP); Chiharu Ota, Kawasaki (JP); Ryosuke Iijima, Setagaya (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 51 days.

(21) Appl. No.: 16/566,555

(22) Filed: Sep. 10, 2019

(65) Prior Publication Data

US 2020/0127083 A1    Apr. 23, 2020

(30) Foreign Application Priority Data

Oct. 22, 2018 (JP) .............................. JP2018-198729

(51) Int. Cl.
*H01L 29/66* (2006.01)
*H01L 29/06* (2006.01)
(Continued)

(52) U.S. Cl.
CPC ........ *H01L 29/063* (2013.01); *H01L 21/0262* (2013.01); *H01L 21/02529* (2013.01);
(Continued)

(58) Field of Classification Search
CPC ........... H01L 29/1608; H01L 29/66272; H01L 29/66666; H01L 29/7395; H01L 29/7802
See application file for complete search history.

(56) References Cited

U.S. PATENT DOCUMENTS

2007/0252172 A1* 11/2007 Hayashi ................ H01L 29/267
257/192

FOREIGN PATENT DOCUMENTS

JP            4857697 B2     1/2012
JP      2012-246168 A     12/2012
(Continued)

OTHER PUBLICATIONS

Tawara, T. et al., "Short minority carrier lifetimes in highly nitrogen-doped 4H—SiC epilayers for suppression of the stacking fault formation in PiN diodes." Journal of Applied Physics, vol. 120, 115101, 2016, doi: 10.1063/1.4962717, https://aip.scitation.org/doi/10.1063/1.4962717, 8 total pages.
(Continued)

*Primary Examiner* — Hoai V Pham
(74) *Attorney, Agent, or Firm* — Oblon, McClelland, Maier & Neustadt, L.L.P.

(57) ABSTRACT

According to one embodiment, a semiconductor device includes a base body including silicon carbide, a first semiconductor region including silicon carbide and a first element, and a second semiconductor region including silicon carbide and the first element. The first semiconductor region includes first and second intermediate regions. A first concentration of the first element in the first intermediate region satisfies a first or a second condition. In the first condition, the first concentration is lower than a second concentration of the first element in the second intermediate region. In the second condition, the first concentration is higher than a third concentration of a second element included in the first intermediate region, the second concentration is higher than a fourth concentration of the second element in the second intermediate region, and a difference between the first and third concentrations is smaller than a difference between the second and fourth concentrations.

11 Claims, 5 Drawing Sheets

(51) Int. Cl.
    *H01L 29/16* (2006.01)
    *H01L 29/32* (2006.01)
    *H01L 21/02* (2006.01)
    *H01L 29/739* (2006.01)
    *H01L 29/78* (2006.01)
    *H01L 29/872* (2006.01)

(52) U.S. Cl.
    CPC .......... *H01L 29/1608* (2013.01); *H01L 29/32* (2013.01); *H01L 29/7395* (2013.01); *H01L 29/7802* (2013.01); *H01L 29/872* (2013.01)

(56) References Cited

FOREIGN PATENT DOCUMENTS

| | | |
|---|---|---|
| JP | 2013-107788 A | 6/2013 |
| JP | 2015-44727 A | 3/2015 |

OTHER PUBLICATIONS

Zhang, X. et al., "Conversion of basal plane dislocations to threading edge dislocations in 4H—SiC epilayers by high temperature annealing," Journal of Applied Physics, vol. 111, 123512, 2012, doi: 10.1063/1.4729326, https://aip.scitation.org/doi/10.1063/1.4729326, 9 total pages.

Tamura, Y. et al., "Molecular Dynamics Simulations for Constriction of Basal Plane Partial Dislocations and Conversion to Threading Edge Dislocation in 4H—SiC," 5p,PB8-2, 13-084, 2017, 2 total pages.

* cited by examiner

US 10,998,401 B2

SEMICONDUCTOR DEVICE HAVING A BASE BODY OF SILICON CARBIDE

CROSS-REFERENCE TO RELATED APPLICATIONS

This application is based upon and claims the benefit of priority from Japanese Patent Application No. 2018-198729, filed on Oct. 22, 2018; the entire contents of which are incorporated herein by reference.

FIELD

Embodiments described herein relate generally to a semiconductor device, a substrate, and a method for manufacturing the semiconductor device.

BACKGROUND

For example, there is a semiconductor device that uses a substrate including silicon carbide (SiC). Stable characteristics of the semiconductor device are desirable.

DETAILED DESCRIPTION

Figure 1A:
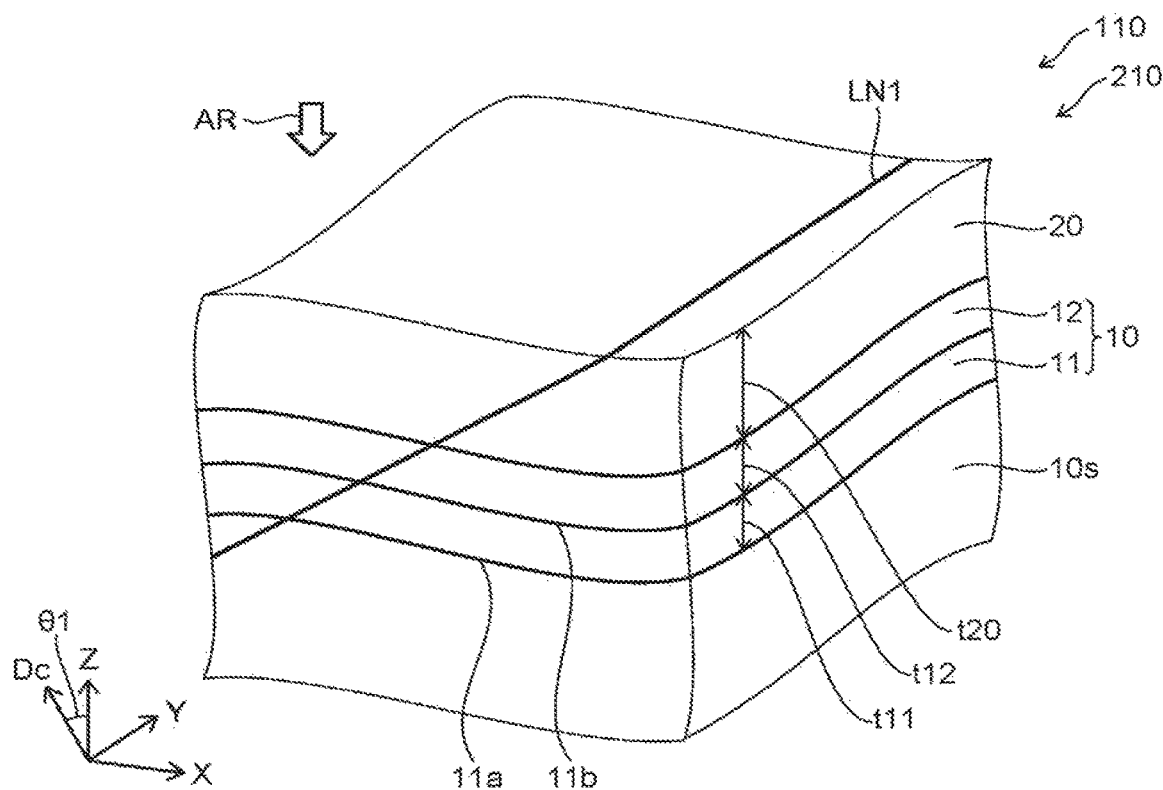
FIG. 1A and FIG. 1B are schematic views illustrating a substrate and a semiconductor device according to a first embodiment.

According to one embodiment, a semiconductor device includes a base body including silicon carbide, a first semiconductor region including silicon carbide and a first element, and a second semiconductor region including silicon carbide and the first element. The first element includes at least one selected from the group consisting of N, P, and As. The first semiconductor region is provided between the base body and the second semiconductor region. The first semiconductor region includes a first intermediate region, and a second intermediate region provided between the first intermediate region and the second semiconductor region. A first concentration of the first element in the first intermediate region satisfies at least one of a first condition or a second condition. In the first condition, the first concentration is lower than a second concentration of the first element in the second intermediate region. In the second condition, the first concentration is higher than a third concentration of a second element included in the first intermediate region, the second concentration is higher than a fourth concentration of the second element in the second intermediate region, and a first difference between the first concentration and the third concentration is smaller than a second difference between the second concentration and the fourth concentration. The second element includes at least one selected from the group consisting of B, Al, and Ga. The first intermediate region includes a first basal plane dislocation, and a first threading edge dislocation connected to the first basal plane dislocation. The second intermediate region includes a second threading edge dislocation connected to the first threading edge dislocation.

According to one embodiment, a substrate includes a base body including silicon carbide, a first semiconductor region including silicon carbide and a first element, and a second semiconductor region including silicon carbide and the first element. The first element includes at least one selected from the group consisting of N, P, and As. The first semiconductor region is provided between the base body and the second semiconductor region. The first semiconductor region includes a first intermediate region, and a second intermediate region provided between the first intermediate region and the second semiconductor region. A first concentration of the first element in the first intermediate region satisfies at least one of a first condition or a second condition. In the first condition, the first concentration is lower than a second concentration of the first element in the second intermediate region. In the second condition, the first concentration is higher than a third concentration of a second element included in the first intermediate region, the second concentration is higher than a fourth concentration of the second element in the second intermediate region, and a first difference between the first concentration and the third concentration is smaller than a second difference between the second concentration and the fourth concentration. The first intermediate region includes a first basal plane dislocation, and a first threading edge dislocation connected to the first basal plane dislocation. The second intermediate region includes a second threading edge dislocation connected to the first threading edge dislocation.

According to another embodiment, a method for manufacturing a semiconductor device is disclosed. The method can include forming a first semiconductor region at a base body including silicon carbide, the first semiconductor region including silicon carbide, and forming a second semiconductor region at the first semiconductor region, the second semiconductor region including silicon carbide. The forming of the first semiconductor region includes forming a first intermediate region by using a first source gas, processing in an atmosphere including hydrogen after the forming of the first intermediate region, and forming, at the first intermediate region after the processing, a second intermediate region by using a second source gas. The first source gas includes silicon, carbon, and a first element. The second source gas includes silicon, carbon, and the first element. A first ratio (C/Si) of a number of carbon atoms included in the first source gas to a number of silicon atoms included in the first source gas is lower than a second ratio (C/Si) of a number of carbon atoms included in the second source gas to a number of silicon atoms included in the second source gas. The first element includes at least one selected from the group consisting of N, P, and As.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
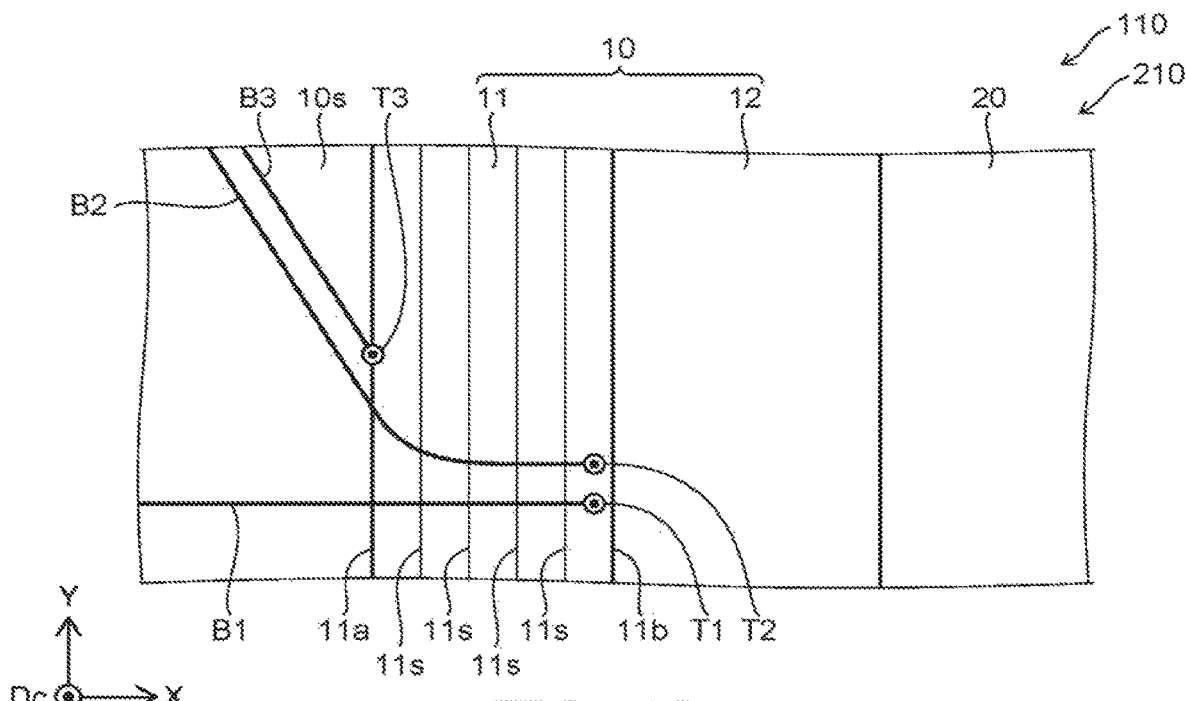

FIG. 1A and FIG. 1B are schematic views illustrating a substrate and a semiconductor device according to a first embodiment.

FIG. 1A is a perspective view. FIG. 1B is a plan view of FIG. 1A cut by a cross section LN1 and viewed along arrow AR. The obliqueness of the cross section LN1 is emphasized for easier viewing of the drawing.

As shown in FIG. 1A, the substrate 210 (and the semiconductor device 110) according to the embodiment include a base body 10s, a first semiconductor region 10, and a second semiconductor region 20.

The base body 10s includes silicon carbide (SiC). The base body 10s is, for example, a SiC substrate. The base body 10s is, for example, a SiC bulk single-crystal substrate. In one example, the SiC that is included in the base body 10s is 4H-SiC. The conductivity type of the base body 10s is arbitrary. Hereinbelow, the conductivity type of the base body 10s is taken to be an n-type.

The first semiconductor region 10 includes silicon carbide and a first element. The second semiconductor region 20 also includes silicon carbide and the first element. The first element includes, for example, at least one selected from the group consisting of N, P, and As. The first semiconductor region 10 and the second semiconductor region 20 are of the n-type. The first element is an n-type impurity. The second semiconductor region 20 is, for example, at least a portion of a drift layer.

The first semiconductor region 10 is provided between the base body 10s and the second semiconductor region 20.

The direction from the base body 10s toward the second semiconductor region 20 is taken as a Z-axis direction. One direction perpendicular to the Z-axis direction is taken as an X-axis direction. A direction perpendicular to the Z-axis direction and the X-axis direction is taken as a Y-axis direction.

The base body 10s spreads along the X-Y plane. The first semiconductor region 10 and the second semiconductor region 20 have layer configurations spreading along the X-Y plane. For example, the Z-axis direction corresponds to the thickness direction (the depth direction) of the base body 10s, the first semiconductor region 10, and the second semiconductor region 20.

The [0001] direction of the silicon carbide of the base body 10s is substantially aligned with the Z-axis direction. The [0001] direction may be oblique to the Z-axis direction. The (0001) plane of the silicon carbide is substantially along the X-Y plane. The (0001) plane may be oblique to the X-Y plane.

For example, the angle between the (0001) plane and the X-Y plane corresponds to an "off angle θ1." The [0001] direction is taken as a direction Dc. The "off angle θ1" corresponds to the angle between the direction Dc and the Z-axis direction. In FIG. 1A, the "off angle θ1" is emphasized for easier viewing of the drawing.

In the embodiment, the "off angle θ1" is, for example, not less than 0 degrees and not more than 10 degrees. The "off angle θ1" may be, for example, not less than 1 degree and not more than 5 degrees. For example, the "off angle θ1" is, for example, about 4 degrees.

The first semiconductor region 10 includes a first intermediate region 11 and a second intermediate region 12. The second intermediate region 12 is provided between the first intermediate region 11 and the second semiconductor region 20.

For example, the first intermediate region 11 is provided on the base body 10s. The second intermediate region 12 is provided on the first intermediate region 11. The second semiconductor region 20 is provided on the second intermediate region 12.

The first intermediate region 11 and the second intermediate region 12 are of the n-type. The first intermediate region 11 and the second intermediate region 12 include silicon carbide and the first element recited above.

For example, the concentration of the n-type impurity in the first intermediate region 11 is lower than the concentration of the n-type impurity in the second intermediate region 12.

For example, the n-type carrier concentration (the carrier density) in the first intermediate region 11 is lower than the n-type carrier concentration (the carrier density) in the second intermediate region 12.

The first intermediate region 11 and the second intermediate region 12 may further include a second element in addition to the first element (the n-type impurity) recited above. The second element includes, for example, at least one selected from the group consisting of B, Al, and Ga. The second element is a p-type impurity.

The concentration (a first concentration) of the first element in the first intermediate region 11 satisfies at least one of a first condition or a second condition recited below.

In the first condition, the first concentration (the concentration of the first element in the first intermediate region 11) is lower than the concentration (a second concentration) of the first element in the second intermediate region 12.

The second condition is as follows. The first concentration (the concentration of the first element in the first intermediate region 11) is higher than the concentration (a third concentration) of the second element included in the first intermediate region 11. The second concentration (the concentration of the first element in the second intermediate region 12) is higher than the concentration (a fourth concentration) of the second element in the second intermediate region 12. A first difference between the first concentration and the third concentration is smaller than a second difference between the second concentration and the fourth concentration.

As recited above, the first intermediate region 11 includes n-type carriers at a low concentration. The second intermediate region 12 includes n-type carriers at a high concentration.

As described below, for example, the second intermediate region 12 functions as a recombination enhancement layer. For example, the first intermediate region 11 functions as a dislocation conversion layer.

As shown in FIG. 1B, a basal plane dislocation (BPD) exists inside the base body 10s. In the example, basal plane dislocations B1 to B3 are illustrated as examples of the basal plane dislocation. For example, the basal plane dislocation B1 has a Burgers vector in the [11-20] direction. The "-" in the notation of "[11-20]" (and in the description of the crystal orientations hereinbelow) denotes a "bar." For example, the basal plane dislocations B2 and B3 have Burgers vectors in the [−2110] direction.

One of the basal plane dislocations (the basal plane dislocation B3) having the Burgers vector of [−2110] becomes a threading edge dislocation (TED) at the vicinity of a first interface 11a between the base body 10s and the first intermediate region 11. In the example, the basal plane dislocation B3 is converted into a threading edge dislocation T3. Thus, a portion of the multiple basal plane dislocations is converted into a threading edge dislocation at the vicinity of the first interface 11a.

Another portion of the multiple basal plane dislocations (the basal plane dislocations B1 and B2) enters the first intermediate region 11 from the base body 10s. For example, the basal plane dislocation B1 progresses through the first intermediate region 11 while maintaining the direction of the base body 10s. On the other hand, the basal plane dislocation B2 progresses through the first intermediate region 11 as the direction of the basal plane dislocation B2 changes from the [−2110] direction to the [11-20] direction of the base body 10s.

Then, the basal plane dislocations B1 and B2 respectively become threading edge dislocations T1 and T2 at the vicinity of a second interface 11b between the first intermediate region 11 and the second intermediate region 12.

Thus, the basal plane dislocations are converted into threading edge dislocations in the first intermediate region 11. For example, the first intermediate region 11 functions as a dislocation conversion layer.

On the other hand, for example, the second intermediate region 12 functions as a recombination enhancement layer. For example, when the semiconductor device 110 (e.g., a power device) operates, holes move from the second semiconductor region 20 side toward the base body 10s. There are cases where stacking faults generated based on the basal plane dislocations may expand when the holes reach the basal plane dislocations. When the stacking faults expand, the operating characteristics of the semiconductor device change. In the embodiment, the n-type carrier concentration in the second intermediate region 12 is high. Thereby, the holes recombine with electrons and disappear inside the second intermediate region 12. The expansion of the stacking faults is suppressed thereby. The change of the operating characteristics of the semiconductor device can be suppressed thereby.

Even in the case where such a second intermediate region 12 is provided, there is a possibility that a portion of the holes may pass through the second intermediate region 12 and reach the first intermediate region 11. In the embodiment, the basal plane dislocations are converted into threading edge dislocations in the first intermediate region 11. An expansion of the stacking faults such as that recited above does not occur even when the holes reach the converted threading edge dislocations. Therefore, the fluctuation of the operating characteristics is suppressed even when a portion of the holes reaches the first intermediate region 11.

Thus, in the embodiment, a semiconductor device and a substrate can be provided in which the characteristics can be stable.

Figure 2A:
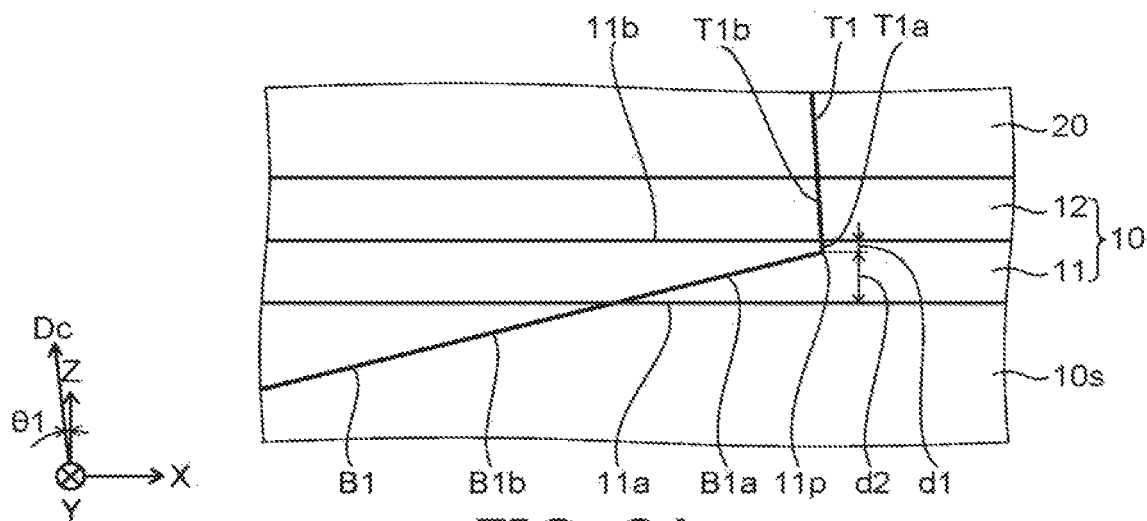
FIG. 2A to FIG. 2C are schematic cross-sectional views illustrating the substrate and the semiconductor device according to the first embodiment.
Figure 2B:
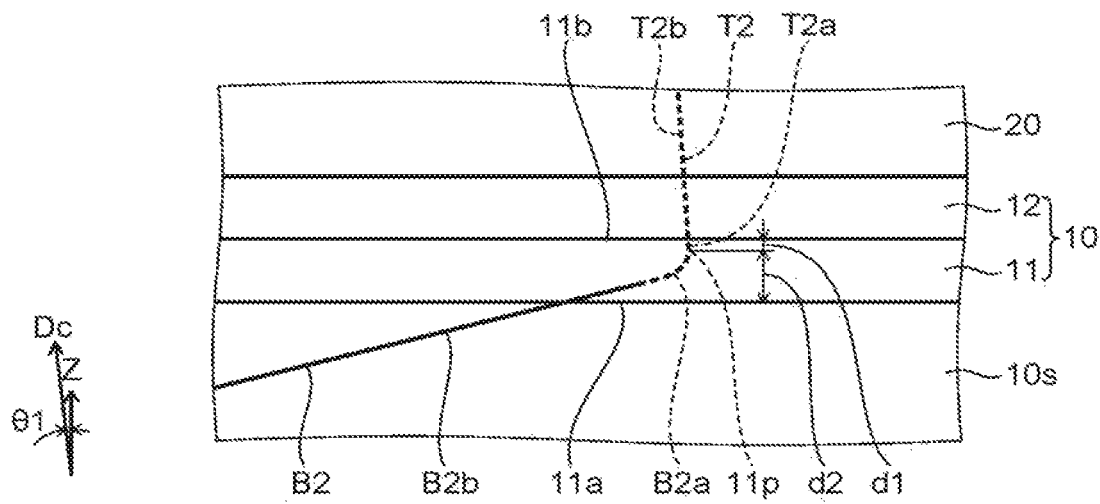
Figure 2C:
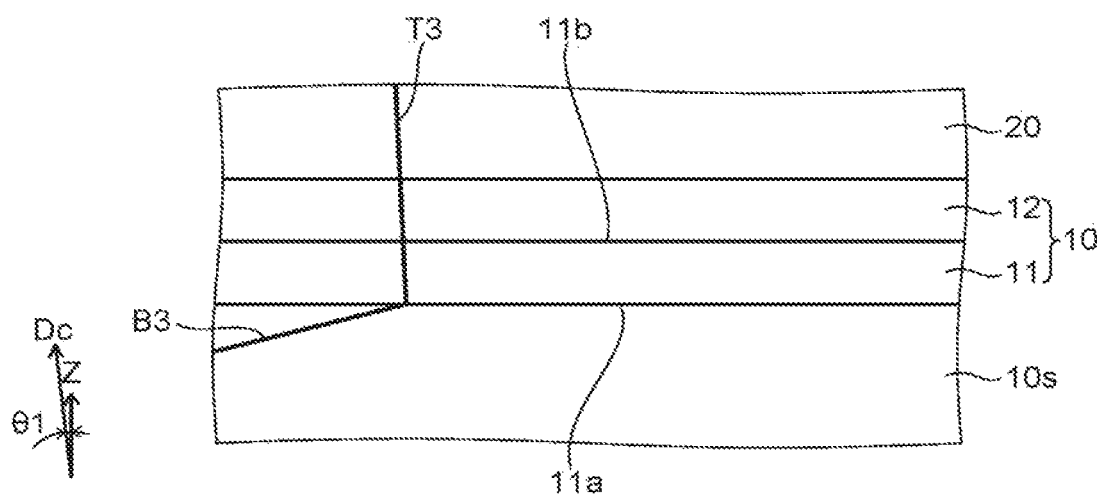

FIG. 2A to FIG. 2C are schematic cross-sectional views illustrating the substrate and the semiconductor device according to the first embodiment.

FIG. 2A to FIG. 2C illustrate cross sections when cut by a plane (in the example, the Z-X plane) including the Z-axis direction. The basal plane dislocations B1 to B3 are illustrated respectively in FIG. 2A to FIG. 2C.

As shown in FIG. 2C, the basal plane dislocation B3 is converted into the threading edge dislocation T3 at the vicinity of the first interface 11a between the base body 10s and the first intermediate region 11. The threading edge dislocation T3 extends inside the first intermediate region 11, the second intermediate region 12, and the second semiconductor region 20 along the direction Dc (the [0001] direction).

On the other hand, as shown in FIG. 2A, the basal plane dislocation B1 progresses through the first intermediate region 11. The basal plane dislocation B1 is converted into the threading edge dislocation T1 inside the first intermediate region 11. The threading edge dislocation T1 extends inside the second intermediate region 12 and the second semiconductor region 20 along the direction Dc (the [0001] direction).

Thus, the first intermediate region 11 includes a first basal plane dislocation B1a (e.g., a portion of the basal plane dislocation B1), and a first threading edge dislocation T1a (e.g., a portion of the threading edge dislocation T1) connected to the first basal plane dislocation B1a. The second intermediate region 12 includes a second threading edge dislocation T1b (e.g., another portion of the threading edge dislocation T1) connected to the first threading edge dislocation T1a.

As shown in FIG. 2B, the basal plane dislocation B2 progresses through the first intermediate region 11. As shown in FIG. 1B, the basal plane dislocation B2 is converted into the threading edge dislocation T2 after the direction changes inside the first intermediate region 11. The threading edge dislocation T2 extends inside the second intermediate region 12 and the second semiconductor region 20 substantially along the direction Dc (the [0001] direction).

Thus, the first intermediate region 11 includes a first basal plane dislocation B2a (e.g., a portion of the basal plane dislocation B2), and a first threading edge dislocation T2a (e.g., a portion of the threading edge dislocation T2) connected to the first basal plane dislocation B2a. The second intermediate region 12 includes a second threading edge dislocation T2b (e.g., another portion of the threading edge dislocation T2) connected to the first threading edge dislocation T2a.

As shown in FIG. 2A, an intersection 11p (a conversion point) between the first basal plane dislocation B1a and the first threading edge dislocation T1a is inside the first intermediate region 11. For example, the intersection 11p may be at the second intermediate region 12 side inside the first intermediate region 11.

The distance between the second intermediate region 12 and the intersection 11p between the first basal plane dislocation B1a and the first threading edge dislocation T1a is taken as a distance d1. The distance d1 is the distance along the direction (the stacking direction) from the base body 10s toward the second semiconductor region 20. The distance along the direction recited above (the stacking direction) between the base body 10s and the intersection 11p recited above is taken as a distance d2. For example, the distance d1 is shorter than the distance d2. The stacking direction corresponds to the Z-axis direction. In one example, the distance d1 is not less than 50 nm and not more than 1000 nm.

Thus, the first basal plane dislocation B1a (e.g., the portion of the basal plane dislocation B1) is converted into the first threading edge dislocation T1a (e.g., the portion of the threading edge dislocation T1) at the vicinity of the interface 11b between the first intermediate region 11 and the second intermediate region 12.

As shown in FIG. 2B, the intersection 11p (the conversion point) between the first basal plane dislocation B2a and the first threading edge dislocation T2a is inside the first intermediate region 11. For example, the intersection 11p may be at the second intermediate region 12 side inside the first intermediate region 11. For example, the distance d1 is shorter than the distance d2. The distance d1 is, for example, not less than 50 nm and not more than 1000 nm. Thus, the first basal plane dislocation B2a (e.g., the portion of the basal plane dislocation B2) is converted into the first threading edge dislocation T2a (e.g., the portion of the threading edge dislocation T2) at the vicinity of the interface 11b between the first intermediate region 11 and the second intermediate region 12.

In the first intermediate region 11 according to the embodiment, for example, the transformation from the first basal plane dislocation B1a (or B2a) to the first threading edge dislocation T1a (or T2a) may be performed by the processing described below. An example of a method for manufacturing the semiconductor device 110 and the substrate 210 according to the embodiment will now be described.

Figure 3:
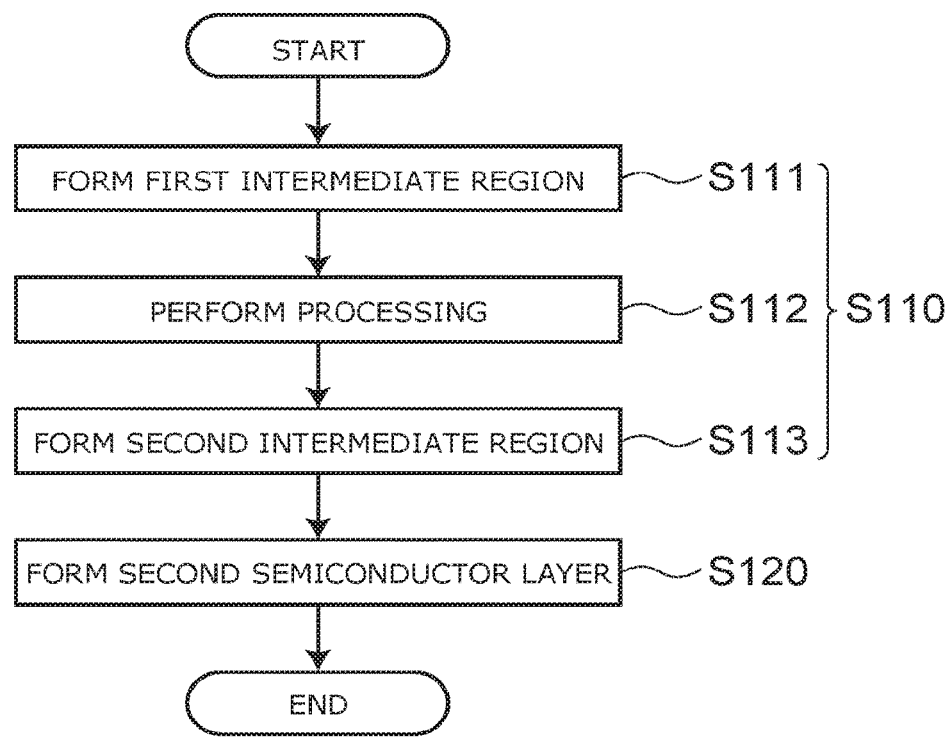
FIG. 3 is a flowchart illustrating the method for manufacturing the substrate and the semiconductor device according to the first embodiment.

FIG. 3 is a flowchart illustrating the method for manufacturing the substrate and the semiconductor device according to the first embodiment.

The manufacturing method includes, for example, a process of forming the first semiconductor region 10 including silicon carbide at the base body 10s including silicon carbide (step S110). The method for manufacturing further includes a process of forming the second semiconductor region 20 including silicon carbide at the first semiconductor region 10 (step S120).

The process of forming the first semiconductor region 10 (step S110) includes a process of forming the first intermediate region 11 by using a first source gas including silicon, carbon, and the first element (step S111). Step S110 further includes a processing process of processing in an atmosphere including hydrogen after the formation of the first intermediate region 11 (step S112). Step S110 further includes a process of forming, at the first intermediate region 11 after the processing process recited above, the second intermediate region 12 by using a second source gas including silicon, carbon, and the first element (step S113).

In the manufacturing method as recited above, the processing process of processing in an atmosphere including hydrogen (step S112) is performed after the formation of the first intermediate region 11. Thereby, it was found that the basal plane dislocations inside the first intermediate region 11 are converted into threading edge dislocations efficiently. For example, 90% or more of the basal plane dislocations inside the first intermediate region 11 are converted into threading edge dislocations. The conversion rate from the basal plane dislocations into the threading edge dislocations inside the first intermediate region 11 is, for example, substantially 95% or more. For example, the conversion rate may be, for example, substantially 98% or more.

On the other hand, for example, in the case of processing in an atmosphere of an inert gas such as Ar, etc., the conversion rate from the basal plane dislocations into the threading edge dislocations is, for example, about 20%.

In the embodiment, the conversion from the basal plane dislocations into the threading edge dislocations is performed at a high conversion rate. The density of the basal plane dislocations in the second intermediate region 12 can be extremely low thereby. Then, even if a small amount of basal plane dislocations exists in the second intermediate region 12, the recombination of the electron-hole pairs can be suppressed by the high n-type carrier concentration (density) of the second intermediate region 12. For example, the expansion of the stacking faults caused by the basal plane dislocations can be suppressed. The fluctuation of the operating characteristics is suppressed thereby. The characteristics can be stable.

In the embodiment as shown in FIG. 1B and FIG. 2A, the base body 10s includes a second basal plane dislocation B1b connected to the first basal plane dislocation B1a of the first intermediate region 11. For example, the first basal plane dislocation B1a (the basal plane dislocation B1) that is connected to the basal plane dislocation B1 exists in the first intermediate region 11 in the case where the basal plane dislocation B1 (the second basal plane dislocation B1b) exists in the base body 10s.

Thus, in one example, the second basal plane dislocation B1b recited above is a portion of the basal plane dislocation B1. In such a case, as shown in FIG. 1B and FIG. 2A, the second basal plane dislocation B1b (the portion of the basal plane dislocation B1) is aligned with the [11-20] direction of the base body 10s. The second threading edge dislocation T1b (the other portion of the threading edge dislocation T1) of the second intermediate region 12 is aligned with the [0001] direction of the second intermediate region 12. The [0001] direction of the second intermediate region 12 is substantially the same as the [0001] direction of the base body 10s. The first threading edge dislocation T1a is aligned with the [0001] direction of the base body 10s.

On the other hand, in the embodiment as shown in FIG. 1B and FIG. 2B, the base body 10s includes a second basal plane dislocation B2b connected to the first basal plane dislocation B2a of the first intermediate region 11. For example, in the case where the basal plane dislocation B2 (the second basal plane dislocation) exists in the base body 10s, the first basal plane dislocation (the basal plane dislocation B2) that is connected to the basal plane dislocation B2 exists in the first intermediate region 11.

In such a case, the second basal plane dislocation B2b (a portion of the basal plane dislocation B2) is aligned with the [−2110] direction of the base body 10s. At least a portion of the first basal plane dislocation B2a (the portion of the basal plane dislocation B2) included in the first intermediate region 11 is aligned with the [11-20] direction of the base body 10s (referring to FIG. 1B). In other words, the direction of the first basal plane dislocation B2a (the portion of the basal plane dislocation B2) included in the first intermediate region 11 changes from the base body 10s toward the second intermediate region 12 so that the change is from the [−2110] direction of the base body 10s toward the [11-20] direction of the base body 10s (referring to FIG. 1B). Then, the first basal plane dislocation B2a (the portion of the basal plane dislocation B2) included in the first intermediate region 11 becomes the first threading edge dislocation T2a (e.g., the portion of the threading edge dislocation T2) inside the first intermediate region 11 (referring to FIG. 1B and FIG. 2B). Also, the second threading edge dislocation T2b (the other portion of the threading edge dislocation T2) of the second intermediate region 12 is aligned with the [0001] direction of the second intermediate region 12. The first threading edge dislocation T2a is aligned with the [0001] direction of the base body 10s.

In the embodiment, the n-type impurity concentration in the second semiconductor region 20 is lower than the n-type impurity concentration in the first intermediate region 11. The n-type impurity concentration in the second semiconductor region 20 is lower than the n-type impurity concentration in the second intermediate region 12.

For example, the concentration (a fifth concentration) of the first element (the n-type impurity) in the second semiconductor region 20 is lower than the first concentration (the concentration of the first element in the first intermediate region 11).

Or, the fifth concentration recited above is higher than the concentration (a sixth concentration) of the second element (the p-type impurity) in the second semiconductor region 20. A third difference between the fifth concentration and the sixth concentration is smaller than the first difference.

For example, the first difference recited above (the difference between the concentration of the n-type impurity and the concentration of the p-type impurity in the first intermediate region 11) is not less than 50 times the third difference recited above (the difference between the concentration of the n-type impurity and the concentration of the p-type impurity in the second semiconductor region 20).

The second difference (the difference between the concentration of the n-type impurity and the concentration of the p-type impurity in the second intermediate region 12) is not less than 2 times the first difference recited above.

For example, the concentration (the first concentration) of the first element (the n-type impurity) in the first intermediate region 11 is, for example, not less than $5 \times 10^{17}$ cm$^{-3}$ and not more than $5 \times 10^{18}$ cm$^{-3}$. The concentration (the third concentration) of the second element (the p-type impurity) in the first intermediate region 11 is, for example, not less than $5 \times 10^{13}$ cm$^{-3}$ and not more than $1 \times 10^{15}$ cm$^{-3}$. Because the first concentration is $5 \times 10^{17}$ cm$^{-3}$ or more, for example, the loss of the semiconductor device can be reduced without increasing the series resistance component. Because the first concentration is $5 \times 10^{18}$ cm$^{-3}$ or less, for example, the occurrence of double Shockley stacking faults can be suppressed in the epitaxial growth.

For example, the concentration (the second concentration) of the first element (the n-type impurity) in the second intermediate region 12 is, for example, not less than $5 \times 10^{18}$ cm$^{-3}$ and not more than $2 \times 10^{19}$ cm$^{-3}$. The concentration (the fourth concentration) of the second element (the p-type impurity) in the second intermediate region 12 is, for example, not less than $1 \times 10^{16}$ cm$^{-3}$ and not more than $2 \times 10^{18}$ cm$^{-3}$. Because the fourth concentration is $1 \times 10^{16}$ cm$^{-3}$ or more, for example, the minority carrier lifetime is short. Thereby, even if a high concentration of holes reaches the second intermediate region 12 due to the occurrence of a surge, etc., the holes can quickly recombine with electrons. As a result, the density of the holes at the position of the intersection 11p can be reduced so that stacking fault expansion substantially does not occur. Because the fourth concentration is $2 \times 10^{18}$ cm$^{-3}$ or less, for example, a stable n-type conductivity can be maintained.

For example, the concentration (the fifth concentration) of the first element (the n-type impurity) in the second semiconductor region 20 is, for example, not less than $1 \times 10^{15}$ cm$^{-3}$ and not more than $1 \times 10^{16}$ cm$^{-3}$. The concentration (the sixth concentration) of the second element (the p-type impurity) in the second semiconductor region 20 is, for example, not less than $5 \times 10^{13}$ cm$^{-3}$ and not more than $3 \times 10^{14}$ cm$^{-3}$. Because the sixth concentration is $5 \times 10^{13}$ cm$^{-3}$ or more, for example, a stable n-type conductivity can be ensured. Because the sixth concentration is $3 \times 10^{14}$ cm$^{-3}$ or less, for example, a long minority carrier lifetime inside the second semiconductor region 20 can be maintained. The forward on-voltage due to the conductivity modulation can be reduced thereby.

For example, the concentration (a seventh concentration) of the first element (the n-type impurity) in the base body 10s is, for example, not less than $5 \times 10^{18}$ cm$^{-3}$ and not more than $1 \times 10^{19}$ cm$^{-3}$. The concentration of the second element (the p-type impurity) in the base body 10s is, for example, not less than $1 \times 10^{14}$ cm$^{-3}$ and not more than $1 \times 10^{17}$ cm$^{-3}$. Because the seventh concentration is $1 \times 10^{14}$ cm$^{-3}$ or more, for example, a stable n-type conductivity can be ensured. Because the seventh concentration is $1 \times 10^{17}$ cm$^{-3}$ or less, for example, the lattice strain can be reduced when the n-type impurity concentration is high. As described below, the base body may be of the p-type.

There are cases where the base body 10s includes the third element in addition to silicon carbide. The third element includes at least one selected from the group consisting of Al, B, Ti, and V. For example, the third element is due to impurities mixing in the manufacturing processes of the base body 10s, etc.

On the other hand, the first semiconductor region 10 (the first intermediate region 11 and the second intermediate region 12) and the second semiconductor region 20 are, for example, epitaxially grown on the base body 10s. Therefore, the concentration of the third element is low in these regions.

For example, the first intermediate region 11 does not include the third element. Or, the concentration of the third element in the first intermediate region 11 is lower than the concentration of the third element in the base body 10s. For example, the first intermediate region 11 may be discriminated from the base body 10s by the difference between the concentrations of the third element.

In the embodiment, a thickness t11 of the first intermediate region 11 (referring to FIG. 1A) is, for example, not less than 500 nm and not more than 3 μm. A thickness t12 of the second intermediate region 12 (referring to FIG. 1A) is, for example, not less than 1 μm and not more than 10 μm. A thickness t20 of the second semiconductor region 20 (referring to FIG. 1A) is, for example, not less than 10 μm and not more than 80 μm.

Several examples of the semiconductor device according to the embodiment will now be described. In the following description, the base body 10s, the first semiconductor region 10, and the second semiconductor region 20 respectively have the configurations recited above.

Figure 4:
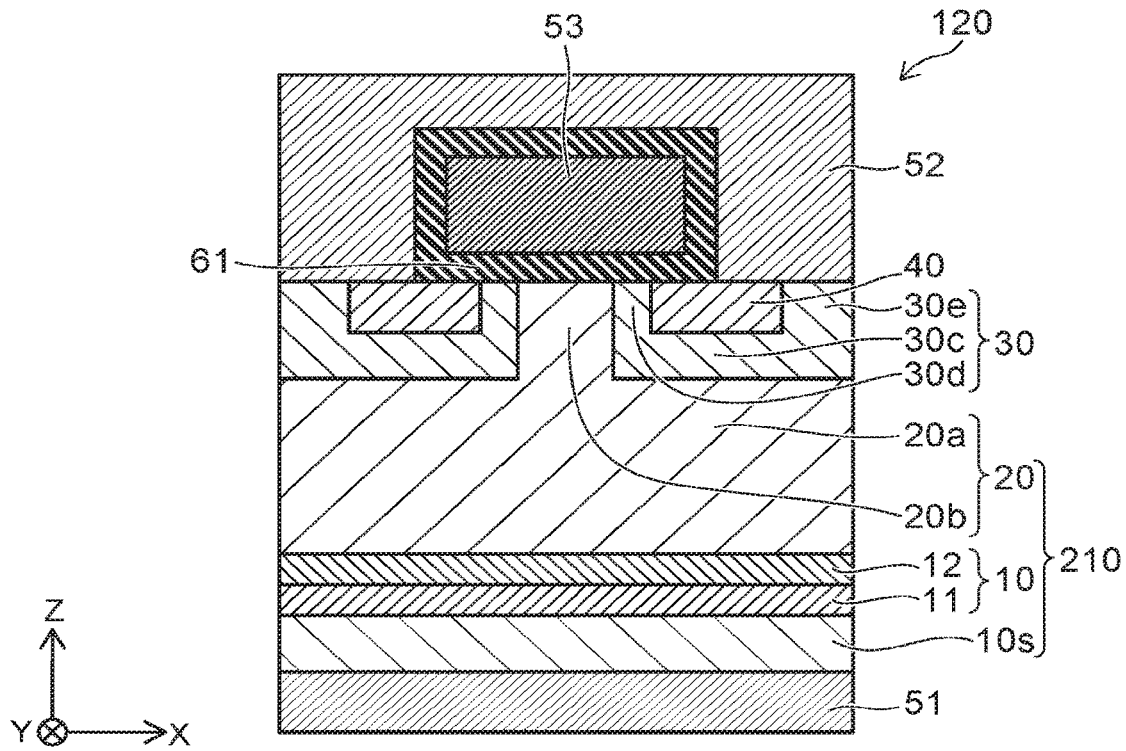
FIG. 4 is a schematic cross-sectional view illustrating a substrate and a semiconductor device according to the first embodiment.

FIG. 4 is a schematic cross-sectional view illustrating a substrate and a semiconductor device according to the first embodiment.

As shown in FIG. 4, the semiconductor device 120 according to the embodiment further includes a third semiconductor region 30, a fourth semiconductor region 40, a first electrode 51, a second electrode 52, a third electrode 53, and an insulating portion 61 in addition to the base body 10s, the first semiconductor region 10, and the second semiconductor region 20.

The third semiconductor region 30 and the fourth semiconductor region 40 include silicon carbide.

The first semiconductor region 10, the second semiconductor region 20, and the fourth semiconductor region 40 are of the n-type. The third semiconductor region 30 is of the p-type. The fourth semiconductor region 40 includes the first element. The third semiconductor region 30 includes the second element.

For example, the third semiconductor region 30 is epitaxially grown on the second semiconductor region 20. For example, the third semiconductor region 30 may be formed by ion-implanting the second element into a portion of a layer used to form the second semiconductor region 20. For example, the fourth semiconductor region 40 may be formed by ion-implanting the first element into a portion of a region including the second element.

In the first direction (e.g., the Z-axis direction), the base body 10s is provided between the first electrode 51 and at least a portion of the second electrode 52 and between the first electrode 51 and the third electrode 53.

The first electrode 51 is electrically connected to the base body 10s.

The second semiconductor region 20 includes a first portion 20a and a second portion 20b. The first portion 20a is between the base body 10s and the at least a portion of the second electrode 52 recited above in the first direction (the Z-axis direction). The second portion 20b is between the base body 10s and the third electrode 53 in the first direction (the Z-axis direction).

The third semiconductor region 30 includes a third portion 30c and a fourth portion 30d. The third portion 30c is between the first portion 20a and the at least a portion of the second electrode 52 recited above in the first direction (the Z-axis direction).

One direction that crosses the first direction is taken as a second direction. The second direction is, for example, the X-axis direction. The position in the second direction (the X-axis direction) of the fourth portion 30d is between the position in the second direction (the X-axis direction) of the second portion 20b and the position in the second direction (the X-axis direction) of the third portion 30c.

The fourth semiconductor region 40 is between the third portion 30c and the at least a portion of the second electrode 52 recited above in the first direction (the Z-axis direction). The fourth semiconductor region 40 is electrically connected to the second electrode 52. A portion of the fourth portion 30d is between the fourth semiconductor region 40 and a portion of the second portion 20b in the second direction (the X-axis direction).

At least a portion of the insulating portion 61 is between the second portion 20b and the third electrode 53.

For example, the first electrode 51 functions as a drain electrode. For example, the second electrode 52 functions as a source electrode. For example, the third electrode 53 functions as a gate electrode. For example, the insulating portion 61 functions as a gate insulating film.

In the case where the base body 10s is of the n-type, the semiconductor device 120 is, for example, a MOSFET. As described below, the base body 10s may be of the p-type.

For example, the second semiconductor region 20 corresponds to, for example, a drift layer. The second semiconductor region 20 is, for example, an n$^-$-region. For example, the third semiconductor region 30 corresponds to a p-well. For example, the fourth semiconductor region 40 corresponds to an n$^+$-source.

In the example, the insulating portion 61 is between the fourth portion 30d and the third electrode 53. The insulating portion 61 is between the fourth semiconductor region 40 and the third electrode 53.

In the example, the third semiconductor region 30 further includes a fifth portion 30e in addition to the third portion 30c and the fourth portion 30d. The fourth semiconductor region 40 is between the fourth portion 30d and the fifth portion 30e in the second direction (e.g., the X-axis direction). The fifth portion 30e also is electrically connected to the second electrode 52.

Figure 5:
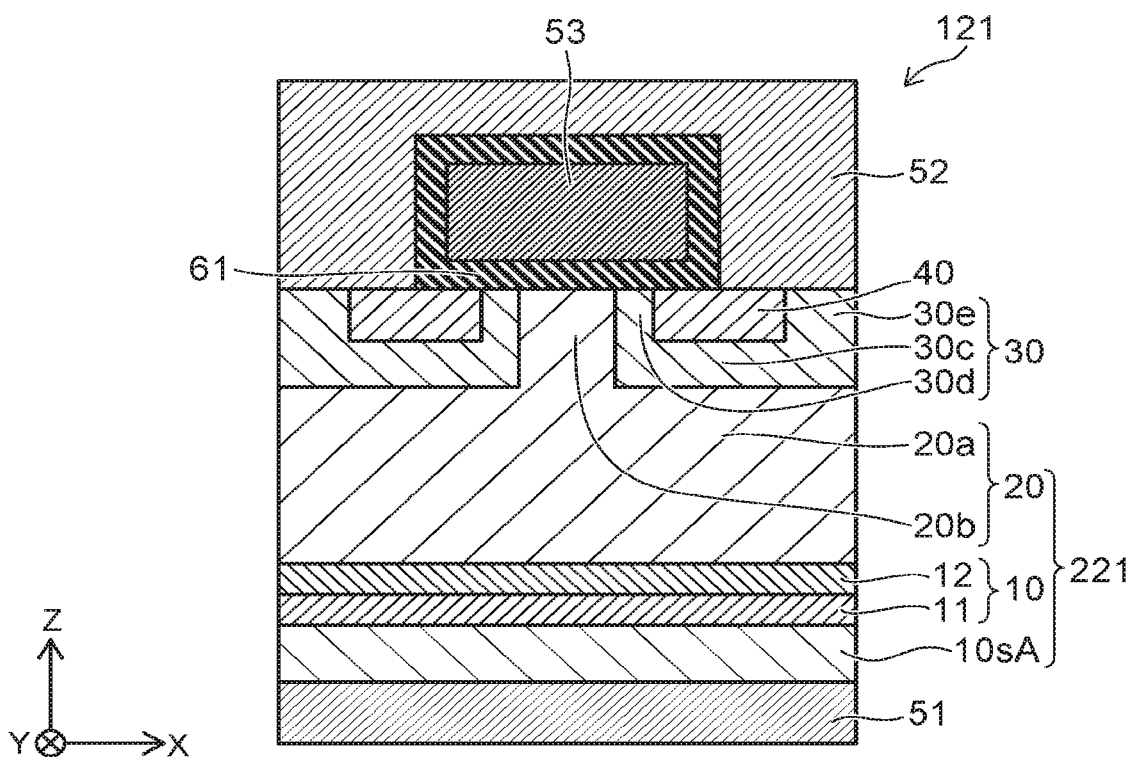
FIG. 5 is a schematic cross-sectional view illustrating a substrate and a semiconductor device according to the first embodiment.

FIG. 5 is a schematic cross-sectional view illustrating a substrate and a semiconductor device according to the first embodiment.

As shown in FIG. 5, the semiconductor device 121 according to the embodiment further includes the third semiconductor region 30, the fourth semiconductor region 40, the first electrode 51, the second electrode 52, the third electrode 53, and the insulating portion 61 in addition to a base body 10sA, the first semiconductor region 10, and the second semiconductor region 20. In the example, the base body 10sA is of the p-type. Otherwise, for example, the configuration of the semiconductor device 121 is similar to the configuration of the semiconductor device 120. The semiconductor device 121 is, for example, an IGBT (Insulated Gate Bipolar Transistor).

In the semiconductor devices 120 and 121, the expansion of the stacking faults caused by the basal plane dislocations can be suppressed. The fluctuation of the operating characteristics is suppressed thereby. The characteristics can be stable. For example, the Vf degradation can be suppressed.

As shown in FIG. 5, a substrate 221 according to the embodiment includes the base body 10sA, the first semiconductor region 10, and the second semiconductor region 20. The base body 10sA includes silicon carbide. The base body 10sA of the substrate 221 is of the p-type.

Figure 6:
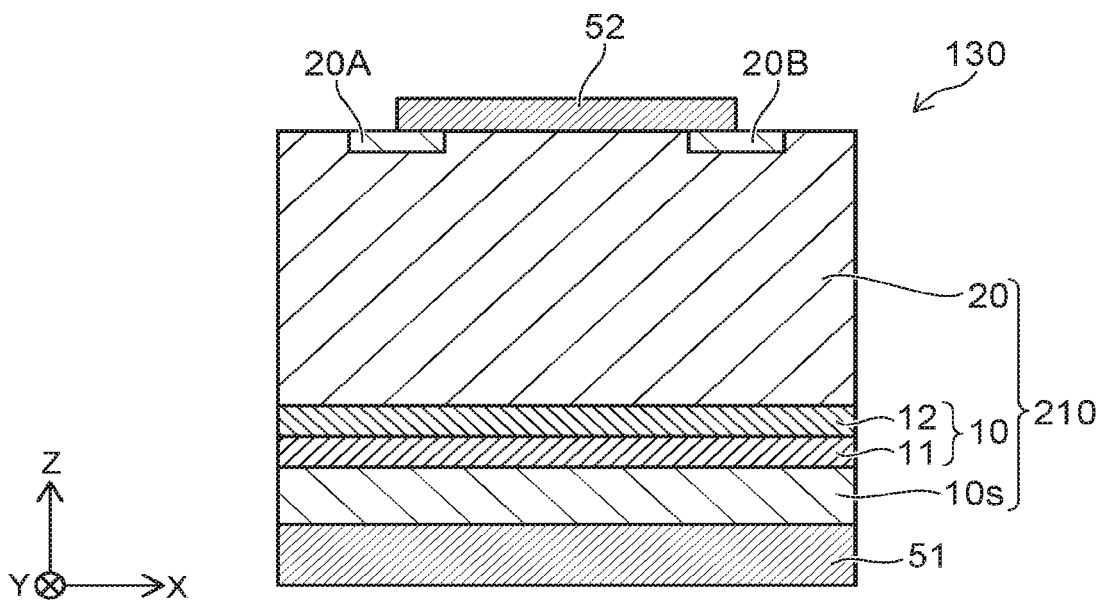
FIG. 6 is a schematic cross-sectional view illustrating a substrate and a semiconductor device according to the first embodiment.

FIG. 6 is a schematic cross-sectional view illustrating a substrate and a semiconductor device according to the first embodiment.

As shown in FIG. 6, the semiconductor device 130 further includes the first electrode 51 and the second electrode 52 in addition to the base body 10s, the first semiconductor region 10, and the second semiconductor region 20. In the example, the base body 10s is of the n-type. As described above, the first semiconductor region 10 and the second semiconductor region 20 also are of the n-type.

The base body 10s is provided between the first electrode 51 and the second electrode 52. The first semiconductor region 10 is provided between the base body 10s and the second electrode 52. The second semiconductor region 20 is provided between the first semiconductor region 10 and the second electrode 52.

For example, the second electrode 52 has a Schottky junction with the second semiconductor region 20. The semiconductor device 130 is, for example, a Schottky diode.

In the example, a junction termination region 20A is provided between the second semiconductor region 20 and one end portion of the second electrode 52. A junction termination region 20B is provided between the second semiconductor region 20 and another end portion of the second electrode 52. The first electrode 51 is, for example, a cathode electrode. The second electrode 52 is, for example, an anode electrode.

Figure 7:
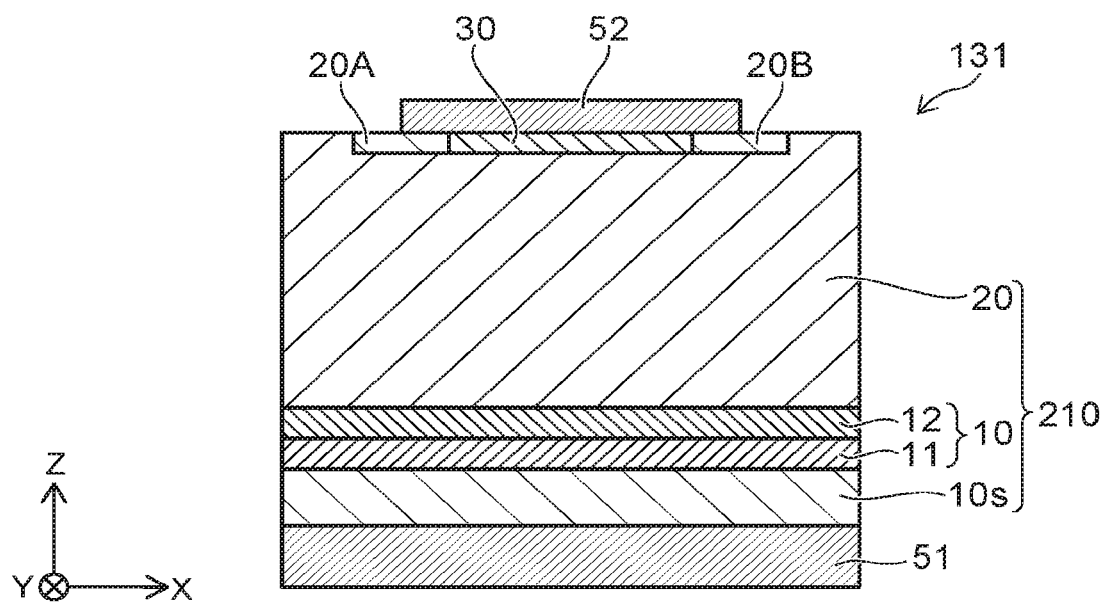
FIG. 7 is a schematic cross-sectional view illustrating a substrate and a semiconductor device according to the first embodiment.

FIG. 7 is a schematic cross-sectional view illustrating a substrate and a semiconductor device according to the first embodiment.

As shown in FIG. 7, the semiconductor device 131 further includes the third semiconductor region 30, the first electrode 51, and the second electrode 52 in addition to the base body 10s, the first semiconductor region 10, and the second semiconductor region 20. In the example, the base body 10s is of the n-type. As described above, the first semiconductor region 10 and the second semiconductor region 20 also are of the n-type. The third semiconductor region 30 is of the p-type. The third semiconductor region 30 includes the second element.

The first semiconductor region 10 is provided between the base body 10s and the third semiconductor region 30. The second semiconductor region 20 is provided between the first semiconductor region 10 and the third semiconductor region 30. The first electrode 51 is electrically connected to the base body 10s. The second electrode 52 is electrically connected to the third semiconductor region 30. The semiconductor device 131 is, for example, a p-n junction diode.

In the semiconductor devices 130 and 131 as well, the expansion of the stacking faults caused by the basal plane dislocations can be suppressed. The fluctuation of the operating characteristics is suppressed thereby. The characteristics can be stable.

In the embodiment, at least one of the first electrode 51 or the second electrode 52 includes, for example, at least one selected from the group consisting of Al, Cu, and Au. For example, the third electrode 53 (e.g., the gate electrode) includes at least one selected from the group consisting of TiN, Al, Ru, W, and TaSiN. The insulating portion 61 includes, for example, at least one selected from the group consisting of silicon oxide, silicon nitride, silicon oxynitride, aluminum oxide, and hafnium oxide.

Second Embodiment

The embodiment relates to a method for manufacturing a semiconductor device (and a substrate). As described above in reference to FIG. 3, the method for manufacturing the semiconductor device (and the substrate) includes, for example, a process of forming the first semiconductor region 10 including silicon carbide at the base body 10s including silicon carbide (step S110) and a process of forming the second semiconductor region 20 including silicon carbide at the first semiconductor region 10 (step S120).

As described in reference to FIG. 3, the process of forming the first semiconductor region 10 (step S110) includes a process of forming the first intermediate region 11 by using the first source gas including silicon, carbon, and the first element (step S111). Step S110 further includes a processing process of processing in an atmosphere including hydrogen after the formation of the first intermediate region 11 (step S112). Step S110 further includes a process of forming, at the first intermediate region 11 after the processing process recited above, the second intermediate region 12 by using the second source gas including silicon, carbon, and the first element (step S113). As described above, the first element includes at least one selected from the group consisting of N, P, and As.

The source gas of Si (silicon) includes, for example, monosilane ($SiH_4$). The source gas of C (carbon) includes, for example, propane ($C_3H_8$). The source gas of the first element includes, for example, nitrogen gas ($N_2$). These source gases may include hydrogen as a carrier gas. The temperature when forming (growing) the first intermediate region 11, the second intermediate region 12, and the second semiconductor region 20 is, for example, not less than 1500° C. and not more than 1800° C.

As described above, the basal plane dislocations inside the first intermediate region 11 are converted into threading edge dislocations efficiently by the processing in the atmosphere including hydrogen.

The temperature of the processing in the atmosphere including hydrogen is, for example, not less than 1400° C. and not more than 1800° C. The time of the processing in the atmosphere including hydrogen is, for example, not less than 10 minutes and not more than 60 minutes. The concentration of hydrogen in the atmosphere including hydrogen is, for example, 50 atomic% or more. The concentration of hydrogen in the atmosphere including hydrogen may be, for example, 90 atomic % or more.

In the embodiment, for example, it is favorable for the composition ratios of the first source gas used in the formation of the first intermediate region 11 and the second source gas used in the formation of the second intermediate region 12 to be different from each other.

For example, a first ratio (C/Si) of the number of carbon atoms included in the first source gas to the number of silicon atoms included in the first source gas is lower than a second ratio (C/Si) of the number of carbon atoms included in the second source gas to the number of silicon atoms included in the second source gas. Thereby, the growth mode of the first intermediate region 11 and the growth mode of the second intermediate region 12 can be different from each other.

Because the ratio C/Si is low, for example, step-flow is the predominant growth mode of forming the first intermediate region 11.

Due to the predominantly step-flow growth mode, for example, a step 11s that is perpendicular to the [11-20] direction (referring to FIG. 1B) is predominant. For example, the angle between the step 11s and the basal plane dislocation B2 which is one of the multiple types of basal plane dislocations (referring to FIG. 1B) is substantially 60 degrees. Such a basal plane dislocation B2 (the dislocation in the [−2110] direction) does not propagate easily. Therefore, the basal plane dislocation B2 (the dislocation in the [−2110] direction) easily changes inside the first intermediate region 11 into the basal plane dislocation B1 (the dislocation in the [11-20] direction) (referring to FIG. 1B). Or, the basal plane dislocation B2 (the dislocation in the [−2110] direction) easily is converted into the threading edge dislocation T2. As described above, the basal plane dislocation B1 (the dislocation in the [11-20] direction) is converted into the threading edge dislocation by processing in an atmosphere including hydrogen.

As described above, as illustrated in FIG. 2A, the first intermediate region 11 includes the first basal plane dislocation B1a, and the first threading edge dislocation T1a connected to the first basal plane dislocation B1a. The second intermediate region 12 includes the second threading edge dislocation T1b connected to the first threading edge dislocation T1a. As illustrated in FIG. 2B, the first intermediate region 11 includes the first basal plane dislocation B2a, and the first threading edge dislocation T2a connected to the first basal plane dislocation B2a. The second intermediate region 12 includes the second threading edge dislocation T2b connected to the first threading edge dislocation T2a.

By forming (epitaxially growing) the first intermediate region 11 by using a low ratio C/Si, the basal plane dislocations can be converted into the threading edge dislocations more efficiently.

The first ratio of the first source gas is, for example, not less than 0.8 but less than 1. The first ratio may be 0.9 or less.

On the other hand, the second ratio of the second source gas is, for example, not less than 1 and not more than 1.3. Because the second ratio is not less than 1, for example, the disturbance of the step-flow due to particle adhesion of downfall, etc., can be recovered early. Because the second ratio is not more than 1.3, for example, a flat growth surface configuration can be obtained.

In the manufacturing method according to the embodiment, the process of forming the second semiconductor region 20 includes forming the second semiconductor region 20 by using a third source gas including silicon, carbon, and the first element recited above. A third ratio (C/Si) of the number of carbon atoms included in the third source gas to the number of silicon atoms included in the third source gas is higher than the first ratio.

The third ratio is, for example, not less than 1 and not more than 1.3. Because the third ratio is not less than 1, for example, the disturbance of the step-flow due to particle adhesion of downfall, etc., can be recovered early. Because the third ratio is not more than 1.3, for example, step bunching can be suppressed in the thick film growth.

In the manufacturing method according to the embodiment, the processing in the atmosphere including hydrogen includes reducing the thickness t11 of the first intermediate region 11. The decrease (e.g., the etching amount) of the thickness t11 of the first intermediate region 11 is, for example, not less than 0.05 µm and not more than 0.8 µm. For example, if the decrease of the thickness t11 is less than 0.05 µm, there are cases where the efficiency of the conversion from the basal plane dislocations into the threading edge dislocations may be low. When the decrease of the thickness t11 exceeds 0.8 µm, for example, the amount of the decrease of the thickness undesirably exceeds the depth of the intersection 11p; and it is difficult to effectively obtain the conversion from the basal plane dislocations into the threading edge dislocations. The decrease of the thickness t11 may be 0.1 µm or more. The decrease of the thickness t11 may be 0.2 µm or more. The conversion from the basal plane dislocations into the threading edge dislocations is obtained more effectively.

For example, there is a reference example in which the surface of the base body 10s is processed in an atmosphere including hydrogen, etc., before the epitaxial growth of the silicon carbide layers on the base body 10s; and in such a case, the object is to remove scratches on the surface of the base body 10s, etc. Therefore, in the reference example, the decrease (the etching amount) of the thickness of the base body 10s is 1 µm or more.

Conversely, in the embodiment, the first intermediate region 11 that is epitaxially grown on the base body 10s is processed in an atmosphere including hydrogen. In the embodiment, conditions that are mild compared to the processing of the base body 10s are employed.

In the manufacturing method according to the embodiment, the first concentration of the first element in the first intermediate region 11 satisfies at least one of the first condition or the second condition recited below.

In the first condition recited above, the first concentration is lower than the second concentration of the first element in the second intermediate region 12.

In the second condition recited above, the first concentration is higher than the third concentration of the second element included in the first intermediate region 11. Also, the second concentration is higher than the fourth concentration of the second element in the second intermediate region 12. Also, the first difference between the first concentration and the third concentration is smaller than the second difference between the second concentration and the fourth concentration.

The first intermediate region 11 and the second intermediate region 12 are of the n-type. The n-type impurity concentration (or the n-type carrier concentration) is lower in the first intermediate region 11 than in the second intermediate region 12. By processing the surface of such a first intermediate region 11, the basal plane dislocations can be converted more efficiently into the threading edge dislocations.

By forming the second intermediate region 12 having the high n-type impurity concentration (or the n-type carrier concentration) on the first intermediate region 11 on which such processing is performed, for example, the holes recombine efficiently with electrons. The expansion of the stacking faults is suppressed thereby. According to the manufacturing method according to the embodiment, a semiconductor device, a substrate, and a method for manufacturing the semiconductor device can be provided in which the characteristics can be stable.

The embodiments may include, for example, the following configurations (e.g., technological proposals).

Configuration 1

A semiconductor device, comprising:
a base body including silicon carbide;
a first semiconductor region including silicon carbide and a first element; and
a second semiconductor region including silicon carbide and the first element,
the first element including at least one selected from the group consisting of N, P, and As,
the first semiconductor region being provided between the base body and the second semiconductor region,
the first semiconductor region including a first intermediate region, and a second intermediate region provided between the first intermediate region and the second semiconductor region,
a first concentration of the first element in the first intermediate region satisfying at least one of a first condition or a second condition,
in the first condition, the first concentration being lower than a second concentration of the first element in the second intermediate region,
in the second condition, the first concentration being higher than a third concentration of a second element included in the first intermediate region, the second concentration being higher than a fourth concentration of the second element in the second intermediate region, a first difference between the first concentration and the third concentration being smaller than a second difference between the second concentration and the fourth concentration,
the second element including at least one selected from the group consisting of B, Al, and Ga,
the first intermediate region including a first basal plane dislocation, and a first threading edge dislocation connected to the first basal plane dislocation,
the second intermediate region including a second threading edge dislocation connected to the first threading edge dislocation.

Configuration 2

The semiconductor device according to Configuration 1, wherein the base body includes a second basal plane dislocation connected to the first basal plane dislocation.

Configuration 3

The semiconductor device according to Configuration 2, wherein
the second basal plane dislocation is aligned with a [11-20] direction of the base body, and
the second threading edge dislocation is aligned with a [0001] direction of the second intermediate region.

Configuration 4

The semiconductor device according to Configuration 2, wherein
the second basal plane dislocation is aligned with a [−2110] direction of the base body,
at least a portion of the first basal plane dislocation included in the first intermediate region is aligned with a [11-20] direction of the base body, and
the second threading edge dislocation is aligned with a [0001] direction of the second intermediate region.

Configuration 5

The semiconductor device according to Configuration 4, wherein a direction of the first basal plane dislocation changes from the base body toward the second intermediate region, the change being from the [−2110] direction of the base body toward the [11-20] direction of the base body.

Configuration 6

The semiconductor device according to any one of Configurations 1 to 5, wherein the first threading edge dislocation is aligned with a [0001] direction of the base body.

Configuration 7

The semiconductor device according to any one of Configurations 1 to 6, wherein
a fifth concentration of the first element in the second semiconductor region is lower than the first concentration, or
the fifth concentration is higher than a sixth concentration of the second element in the second semiconductor region, and a third difference between the fifth concentration and the sixth concentration is smaller than the first difference.

Configuration 8

The semiconductor device according to Configuration 7, wherein the first difference is not less than 50 times the third difference.

Configuration 9

The semiconductor device according to any one of Configurations 1 to 8, wherein the second difference is not less than 2 times the first difference.

Configuration 10

The semiconductor device according to any one of Configurations 1 to 9, wherein
the base body includes a third element including at least one selected from the group consisting of Al, B, Ti, and V, and
the first intermediate region does not include the third element, or a concentration of the third element in the first intermediate region is lower than a concentration of the third element in the base body.

Configuration 11

A semiconductor device, comprising:
a base body including silicon carbide;
a first semiconductor region including silicon carbide; and
a second semiconductor region including silicon carbide,
the first semiconductor region being provided between the base body and the second semiconductor region,
the first semiconductor region including a first intermediate region, and a second intermediate region provided between the first intermediate region and the second semiconductor region,
the first intermediate region including a first basal plane dislocation, and a first threading edge dislocation connected to the first basal plane dislocation,
the base body including a second basal plane dislocation connected to the first basal plane dislocation,
the second basal plane dislocation being aligned with a [−2110] direction of the base body,
at least a portion of the first basal plane dislocation being aligned with a [11-20] direction of the base body,
the first threading edge dislocation being aligned with a [0001] direction of the base body.

Configuration 12

The semiconductor device according to Configuration 11, wherein a direction of the first basal plane dislocation changes from the base body toward the second intermediate region, the change being from the [−2110] direction of the base body toward the [11-20] direction of the base body.

Configuration 13

The semiconductor device according to any one of Configurations 1 to 12, further comprising:
a first electrode; and
a second electrode,
the base body being provided between the first electrode and the second electrode,
the first semiconductor region being provided between the base body and the second electrode,
the second semiconductor region being provided between the first semiconductor region and the second electrode.

Configuration 14

The semiconductor device according to any one of Configurations 1 to 13, further comprising:
a third semiconductor region including silicon carbide;
a first electrode; and
a second electrode,
the first semiconductor region and the second semiconductor region being of an n-type,
the third semiconductor region being of a p-type,
the first semiconductor region being provided between the base body and the third semiconductor region,
the second semiconductor region being provided between the first semiconductor region and the third semiconductor region,
the first electrode being electrically connected to the base body,
the second electrode being electrically connected to the third semiconductor region.

Configuration 15

The semiconductor device according to any one of Configurations 1 to 12, further comprising:
a third semiconductor region including silicon carbide;
a fourth semiconductor region including silicon carbide;
a first electrode;
a second electrode;
a third electrode; and
an insulating portion,
the first semiconductor region, the second semiconductor region, and the fourth semiconductor region being of an n-type,
the third semiconductor region being of a p-type,
in a first direction, the base body being provided between the first electrode and at least a portion of the second electrode and between the first electrode and the third electrode,
the second semiconductor region including a first portion and a second portion,
the first portion being between the base body and the at least a portion of the second electrode in the first direction,
the second portion being between the base body and the third electrode in the first direction,
the third semiconductor region including a third portion and a fourth portion,
the third portion being between the first portion and the at least a portion of the second electrode in the first direction,
a position in a second direction of the fourth portion being between a position in the second direction of the second portion and a position in the second direction of the third portion, the second direction crossing the first direction,
the fourth semiconductor region being between the third portion and the at least a portion of the second electrode in the first direction,
the fourth semiconductor region being electrically connected to the second electrode,
a portion of the fourth portion being between the fourth semiconductor region and a portion of the second portion in the second direction,
at least a portion of the insulating portion being between the second portion and the third electrode.

Configuration 16

The semiconductor device according to any one of Configurations 1 to 15, wherein a distance along a stacking direction between the second semiconductor region and an intersection is shorter than a distance along the stacking direction between the intersection and the base body, the intersection being between the first basal plane dislocation and the first threading edge dislocation, the stacking direction being from the base body toward the second intermediate region.

Configuration 17

A substrate, comprising:

a base body including silicon carbide;

a first semiconductor region including silicon carbide and a first element; and a second semiconductor region including silicon carbide and the first element, the first element including at least one selected from the group consisting of N, P, and As, the first semiconductor region being provided between the base body and the second semiconductor region, the first semiconductor region including a first intermediate region, and a second intermediate region provided between the first intermediate region and the second semiconductor region, a first concentration of the first element in the first intermediate region satisfying at least one of a first condition or a second condition, in the first condition, the first concentration being lower than a second concentration of the first element in the second intermediate region, in the second condition, the first concentration being higher than a third concentration of a second element included in the first intermediate region, the second concentration being higher than a fourth concentration of the second element in the second intermediate region, and a first difference between the first concentration and the third concentration being smaller than a second difference between the second concentration and the fourth concentration, the first intermediate region including a first basal plane dislocation, and a first threading edge dislocation connected to the first basal plane dislocation, the second intermediate region including a second threading edge dislocation connected to the first threading edge dislocation.

Configuration 18

A substrate, comprising:

a base body including silicon carbide;

a first semiconductor region including silicon carbide; and a second semiconductor region including silicon carbide, the first semiconductor region being provided between the base body and the second semiconductor region, the first semiconductor region including a first intermediate region, and a second intermediate region provided between the first intermediate region and the second semiconductor region, the first intermediate region including a first basal plane dislocation, and a first threading edge dislocation connected to the first basal plane dislocation, the base body including a second basal plane dislocation connected to the first basal plane dislocation, the second basal plane dislocation being aligned with a [−2110] direction of the base body, at least a portion of the first basal plane dislocation being aligned with a [11-20] direction of the base body, the first threading edge dislocation being aligned with a [0001] direction of the base body.

Configuration 19

A method for manufacturing a semiconductor device, comprising:

forming a first semiconductor region at a base body including silicon carbide, the first semiconductor region including silicon carbide; and forming a second semiconductor region at the first semiconductor region, the second semiconductor region including silicon carbide, the forming of the first semiconductor region including forming a first intermediate region by using a first source gas, the first source gas including silicon, carbon, and a first element, processing in an atmosphere including hydrogen after the forming of the first intermediate region, and forming, at the first intermediate region after the processing, a second intermediate region by using a second source gas, the second source gas including silicon, carbon, and the first element, a first ratio (C/Si) of a number of carbon atoms included in the first source gas to a number of silicon atoms included in the first source gas being lower than a second ratio (C/Si) of a number of carbon atoms included in the second source gas to a number of silicon atoms included in the second source gas, the first element including at least one selected from the group consisting of N, P, and As.

Configuration 20

The method for manufacturing the semiconductor device according to Configuration 19, wherein the first intermediate region includes a first basal plane dislocation, and a first threading edge dislocation connected to the first basal plane dislocation, and the second intermediate region includes a second threading edge dislocation connected to the first threading edge dislocation.

Configuration 21

The method for manufacturing the semiconductor device according to Configuration 19 or 20, wherein the first ratio is not less than 0.8 but less than 1.

Configuration 22

The method for manufacturing the semiconductor device according to any one of Configurations 19 to 21, wherein the second ratio is not less than 1 and not more than 1.3.

Configuration 23

The method for manufacturing the semiconductor device according to any one of Configurations 19 to 22, wherein the forming of the second semiconductor region includes forming the second semiconductor region by using a third source gas including silicon, carbon, and the first element, and a third ratio (C/Si) of a number of carbon atoms included in the third source gas to a number of silicon atoms included in the third source gas is higher than the first ratio.

Configuration 24

The method for manufacturing the semiconductor device according to any one of Configurations 19 to 23, wherein the processing includes reducing a thickness of the first intermediate region, and the reducing of the thickness of the first intermediate region is not less than 0.05 μm and not more than 0.8 μm.

Configuration 25

The method for manufacturing the semiconductor device according to any one of Configurations 19 to 24, wherein a first concentration of the first element in the first intermediate region satisfies at least one of a first condition or a second condition, in the first condition, the first concentration is lower than a second concentration of the first element in the second intermediate region, in the second condition, the first concentration is higher than a third concentration of the second element included in the first intermediate region, the second concentration is higher than a fourth concentration of the second element in the second intermediate region, and a first difference between the first concentration and the third concentration is smaller than a second difference between the second concentration and the fourth concentration, and the second element includes at least one selected from the group consisting of B, Al, and Ga.

According to the embodiments, a semiconductor device, a substrate, and a method for manufacturing the semiconductor device can be provided in which the characteristics can be stable.

In the embodiments, the information that relates to the crystal orientation is obtained by, for example, X-ray diffraction analysis, etc. The information that relates to the basal plane dislocation and the threading edge dislocation is obtained by, for example, at least one of X-ray topography or photoluminescence imaging. For example, by X-ray topography, an image of the basal plane dislocation and the threading edge dislocation can be visualized over a wide range in the depth direction. For example, by photoluminescence imaging, the information that relates to the basal plane dislocation is obtained in layers (e.g., the drift layer, e.g., the second semiconductor region 20) having a low carrier concentration, etc.

In the embodiment, for example, the information that relates to the impurity concentration is obtained by SIMS (Secondary Ion Mass Spectrometry), etc. In the description recited above, the impurity concentration may be, for example, the carrier concentration. For example, the information that relates to the relative level of the impurity concentration can be obtained based on information relating to the relative level of the carrier concentration obtained by SCM (Scanning Capacitance Microscopy).

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, substrates, and methods for manufacturing semiconductor devices practicable by an appropriate design modification by one skilled in the art based on the semiconductor devices, the substrates, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
    a base body including silicon carbide;
    a first semiconductor region including silicon carbide and a first element; and
    a second semiconductor region including silicon carbide and the first element,
    the first element including at least one selected from the group consisting of N, P, and As,
    the first semiconductor region being provided between the base body and the second semiconductor region,
    the first semiconductor region including a first intermediate region, and a second intermediate region provided between the first intermediate region and the second semiconductor region,
    a first concentration of the first element in the first intermediate region satisfying at least one of a first condition or a second condition,
    in the first condition, the first concentration being lower than a second concentration of the first element in the second intermediate region,
    in the second condition, the first concentration being higher than a third concentration of a second element included in the first intermediate region, the second concentration being higher than a fourth concentration of the second element in the second intermediate region, and a first difference between the first concentration and the third concentration being smaller than a second difference between the second concentration and the fourth concentration,
    the second element including at least one selected from the group consisting of B, Al, and Ga,
    the first intermediate region including a first basal plane dislocation, and a first threading edge dislocation connected to the first basal plane dislocation,
    the second intermediate region including a second threading edge dislocation connected to the first threading edge dislocation.

2. The device according to claim 1, wherein the base body includes a second basal plane dislocation connected to the first basal plane dislocation.

3. The device according to claim 2, wherein
    the second basal plane dislocation is aligned with a [11-20] direction of the base body, and
    the second threading edge dislocation is aligned with a [0001] direction of the second intermediate region.

4. The device according to claim 2, wherein
the second basal plane dislocation is aligned with a [−2110] direction of the base body,
at least a portion of the first basal plane dislocation included in the first intermediate region is aligned with a [11-20] direction of the base body, and
the second threading edge dislocation is aligned with a [0001] direction of the second intermediate region.

5. The device according to claim 4, wherein a direction of the first basal plane dislocation changes from the base body toward the second intermediate region, the change being from the [−2110] direction of the base body toward the [11-20] direction of the base body.

6. The device according to claim 5, wherein the first threading edge dislocation is aligned with a [0001] direction of the base body.

7. The device according to claim 1, wherein
a fifth concentration of the first element in the second semiconductor region is lower than the first concentration, or
the fifth concentration is higher than a sixth concentration of the second element in the second semiconductor region, and a third difference between the fifth concentration and the sixth concentration is smaller than the first difference.

8. The device according to claim 1, wherein
the base body includes a third element including at least one selected from the group consisting of Al, B, Ti, and V, and
the first intermediate region does not include the third element, or a concentration of the third element in the first intermediate region is lower than a concentration of the third element in the base body.

9. The device according to claim 1, further comprising:
a third semiconductor region including silicon carbide;
a first electrode; and
a second electrode,
the first semiconductor region and the second semiconductor region being of an n-type,
the third semiconductor region being of a p-type,
the first semiconductor region being provided between the base body and the third semiconductor region,
the second semiconductor region being provided between the first semiconductor region and the third semiconductor region,
the first electrode being electrically connected to the base body,
the second electrode being electrically connected to the third semiconductor region.

10. The device according to claim 1, further comprising:
a third semiconductor region including silicon carbide;
a fourth semiconductor region including silicon carbide;
a first electrode;
a second electrode;
a third electrode; and
an insulating portion,
the first semiconductor region, the second semiconductor region, and the fourth semiconductor region being of an n-type,
the third semiconductor region being of a p-type,
in a first direction, the base body being provided between the first electrode and at least a portion of the second electrode and between the first electrode and the third electrode,
the second semiconductor region including a first portion and a second portion,
the first portion being between the base body and the at least a portion of the second electrode in the first direction,
the second portion being between the base body and the third electrode in the first direction,
the third semiconductor region including a third portion and a fourth portion,
the third portion being between the first portion and the at least a portion of the second electrode in the first direction,
a position in a second direction of the fourth portion being between a position in the second direction of the second portion and a position in the second direction of the third portion, the second direction crossing the first direction,
the fourth semiconductor region being between the third portion and the at least a portion of the second electrode in the first direction,
the fourth semiconductor region being electrically connected to the second electrode,
a portion of the fourth portion being between the fourth semiconductor region and a portion of the second portion in the second direction,
at least a portion of the insulating portion being between the second portion and the third electrode.

11. A substrate, comprising:
a base body including silicon carbide;
a first semiconductor region including silicon carbide and a first element; and
a second semiconductor region including silicon carbide and the first element,
the first element including at least one selected from the group consisting of N, P, and As,
the first semiconductor region being provided between the base body and the second semiconductor region,
the first semiconductor region including a first intermediate region, and a second intermediate region provided between the first intermediate region and the second semiconductor region,
a first concentration of the first element in the first intermediate region satisfying at least one of a first condition or a second condition,
in the first condition, the first concentration being lower than a second concentration of the first element in the second intermediate region,
in the second condition, the first concentration being higher than a third concentration of a second element included in the first intermediate region, the second concentration being higher than a fourth concentration of the second element in the second intermediate region, and a first difference between the first concentration and the third concentration being smaller than a second difference between the second concentration and the fourth concentration,
the first intermediate region including a first basal plane dislocation, and a first threading edge dislocation connected to the first basal plane dislocation,
the second intermediate region including a second threading edge dislocation connected to the first threading edge dislocation.

* * * * *